(12) United States Patent
Chien et al.

(10) Patent No.: US 7,283,603 B1
(45) Date of Patent: Oct. 16, 2007

(54) SHIFT REGISTER WITH FOUR PHASE CLOCKS

(75) Inventors: Chih Yuan Chien, Taipei (TW); Ming Sheng Lai, Taipei (TW)

(73) Assignee: AU Optronics Corporation, Hsinchu (TW)

( * ) Notice: Subject to any disclaimer, the term of this patent is extended or adjusted under 35 U.S.C. 154(b) by 0 days.

(21) Appl. No.: 11/399,803

(22) Filed: Apr. 7, 2006

(51) Int. Cl.
*G11C 19/00* (2006.01)
(52) U.S. Cl. .......................... 377/64; 345/100
(58) Field of Classification Search ........ 327/231–241, 327/291–299; 377/64
See application file for complete search history.

(56) References Cited

U.S. PATENT DOCUMENTS

| | | | |
|---|---|---|---|
| 6,426,743 B1 | 7/2002 | Yeo et al. ................ 345/213 |
| 6,757,054 B2 * | 6/2004 | Watanabe et al. ............ 356/5.1 |
| 6,845,140 B2 | 1/2005 | Moon et al. ................ 377/78 |
| 7,151,278 B2 * | 12/2006 | Nagao et al. ................ 257/72 |
| 2002/0180501 A1 * | 12/2002 | Baker et al. ............... 327/158 |
| 2003/0210220 A1 | 11/2003 | Hebiguchi ................ 345/100 |
| 2005/0212746 A1 | 9/2005 | Iwasaki et al. ............ 345/100 |
| 2005/0264514 A1 | 12/2005 | Kim et al. ................ 345/100 |
| 2007/0046347 A1 * | 3/2007 | Lee ............................ 327/158 |

OTHER PUBLICATIONS

Chiang, Chun-sung et al., "Electrical Instability of Hydrogenated Amorphous Silicon Thin-Film Transistors for Active-Matrix Liquid-Crystal Displays," *Jpn. J. Appl. Phys.*, vol. 37, pp. 4704-4710 (1998).
Oritsuki, Ryoji et al., "Threshold Voltage Shift of Amorphous Silicon Thin-Film Transistors During Pulse Operation," *Jpn. J. Appl. Phys.*, vol. 30, pp. 3719-3723 (1991).

* cited by examiner

Primary Examiner—Tuan T. Lam
Assistant Examiner—Hiep Nguyen
(74) Attorney, Agent, or Firm—Tim Tingkang Xia; Morris Manning Martin LLP

(57) ABSTRACT

A shift register comprising means for providing a first pair of clock signals, CLK1 and XCLK1, with a first frequency, $f_1$, and a second pair of clock signals, CLK2 and XCLK2, with a second frequency, $f_2$, where the second frequency $f_2$ is different from the first frequency $f_1$, and means for generating a plurality of signals responsive to a start pulse signal, the first pair of clock signals CLK1 and XCLK1, and the second pair of clock signals CLK2 and XCLK2. Each of the plurality of signals is sequentially shifted from the start pulse signal.

32 Claims, 4 Drawing Sheets

SHIFT REGISTER WITH FOUR PHASE CLOCKS

FIELD OF THE INVENTION

The present invention relates generally to a shift register, and in particular to a shift register having four phase clocks.

BACKGROUND OF THE INVENTION

A liquid crystal display (hereinafter "LCD") includes an LCD panel formed with liquid crystal cells and pixel elements with each associating with a corresponding liquid crystal cell. These pixel elements are substantially arranged in the form of a matrix having gate lines in rows and data lines in columns. The LCD panel is driven by a driving circuit including a gate driver and a data driver. The gate driver generates a plurality of gate signals (scanning signals) sequentially applied to the gate lines for sequentially turning on the pixel elements row-by-row. The data driver generates a plurality of source signals (data signals), i.e., sequentially sampling image signals, simultaneously applied to the data lines in conjunction with the gate signals applied to the gate lines for aligning states of the liquid crystal cells on the LCD panel to control light transmittance therethrough, thereby displaying an image on the LCD.

In such a driving circuit, a shift register is utilized in the gate driver to generate the plurality of gate signals for sequentially driving the gate lines. To lower down costs, there have been efforts to integrate the shift register into an LCD panel. One of the efforts, for example, is to fabricate the shift register on a glass substrate of the LCD panel using an amorphous silicon (hereinafter "a-Si") thin film transistors (hereinafter "TFTs"), and/or low temperature polycrystalline silicon (hereinafter "LTPS") TFTs.

Conventionally, a shift register having multiple stages is designed such that in operation there are some TFTs that are turned on for a long period of time for the purpose of discharges. Additionally, such a shift register is usually supplied with two or more clock signals to substantially shift an output signal of a stage from its input signal that is an output signal of its immediately prior stage, thereby generating of a plurality of sequentially shifted output signals. If the two or more clock signals have a same frequency that is very high, some TFTs in the shift register may frequently be turned on during operation. However, when voltages are continually or frequently applied to TFTs made from a-Si and/or LTPS material for a long period of time, the characteristics of the TFTs may deteriorate due to stress thereon and thus the TFTs may not function properly, thereby reducing the reliability of the shift register.

Therefore, a heretofore unaddressed need exists in the art to address the aforementioned deficiencies and inadequacies.

SUMMARY OF THE INVENTION

The present invention, in one aspect, relates to a shift register. In one embodiment, the shift register includes a start pulse input line for providing a start pulse, SP, a first signal line for providing a first clock signal, CLK1, a second signal line for providing a second clock signal, CLK2, a third signal line for providing a third clock signal, XCLK1, and a fourth signal line for providing a fourth clock signal, XCLK2. Each of the first to fourth clock signals CLK1, CLK2, XCLK1 and XCLK2 is characterized with a frequency and a phase. The frequency of the first clock signal CLK1 is higher than the frequency of the second clock signal CLK2. In one embodiment, the frequency of the first clock signal CLK1 and the frequency of the third clock signal XCLK1 are substantially identical and the phase of the first clock signal CLK1 and the phase of the third clock signal XCLK1 are substantially reversed, and the frequency of the second clock signal CLK2 and the frequency of the fourth clock signal XCLK2 are substantially identical and the phase of the second clock signal CLK2 and the phase of the fourth clock signal XCLK2 are substantially reversed, respectively.

Furthermore, the shift register includes a reference line for providing a supply voltage, VSS. Moreover, the shift register includes a plurality of stages, $\{S_j\}$, j=1, 2, N, N being a positive integer. The j-th stage $S_j$ comprises a first to fourth inputs, IN1 to IN4, wherein when j is an odd number, the first to fourth inputs IN1 to IN4 are electrically coupled to the first, second, third and fourth signal lines for receiving the first, second, third and fourth clock signals CLK1, CLK2, XCLK1 and XCLK2, respectively and when j is an even number, the first to fourth inputs IN1 to IN4 are electrically coupled to the third, fourth, first and second signal lines for receiving the third, fourth, first and second clock signal XCLK1, XCLK2, CLK1 and CLK2, respectively. The j-th stage $S_j$ further comprises a fifth input IN5 for receiving an input signal, a first output O1 electrically coupled to a corresponding gate for providing a gate driving signal to the gate responsive to the input signal and the first to fourth clock signals CLK1, CLK2, XCLK1 and XCLK2, where the gate driving signal is shifted from the input signal, and a second output O2 for providing an output signal having a frequency and a phase that are substantially same as those of the gate driving signal, respectively. The plurality of stages $\{S_j\}$ are electrically coupled in serial with that the fifth input IN5 of the first stage $S_1$ is electrically coupled to the start pulse input line for receiving the start pulse SP and the fifth input IN5 of the i-th stage $S_i$, i=2, 3, . . . N, is electrically coupled to the second output O2 of its immediately prior stage, $S_{i-1}$, for receiving a corresponding output signal therefrom. The j-th stage $S_j$ further comprises a sixth input IN6 electrically coupled to the reference line for receiving the supply voltage VSS.

The j-th stage $S_j$ also comprises (a) an input transistor M1 having a gate electrically coupled to the fifth input IN5, a source electrically coupled to a node 1 and a drain electrically coupled to a node 5, respectively, where the node 1 is electrically coupled to the fifth input IN5, (b) a first discharge transistor M5 having a gate electrically coupled to a node 4, a source electrically coupled to the sixth input IN6 and a drain electrically coupled to the node 5, respectively, (c) a first discharge control circuit comprising transistors M2, M3, M4 and M6, each of the transistors M2, M3, M4 and M6 having a gate, a source and a drain, where both the gate and the drain of the transistor M2 are electrically coupled to the fourth input IN4, and the source of the transistor M2 is electrically coupled to a node 7, respectively, where the gate, the source and the drain of the transistor M3 are electrically coupled to the node 1, the sixth input IN6 and the node 7, respectively, where the gate, the source and the drain of the transistor M4 are electrically coupled to a node 14, the sixth input IN6 and a node 6 that is electrically coupled to both the node 7 and the node 4, respectively, and where the gate, the source and the drain of the transistor M6 are electrically coupled to the second input IN2, the sixth input IN6 and the node 4, respectively, (d) a second discharge control circuit comprising transistors M7, M8, M9 and M11, each of the transistors M7, M8, M9 and M11 having a gate, a source and a drain, where both the gate and the drain of the transistor M7 are electrically coupled to the second input IN2, and the source of the transistor M7 is electrically coupled to a node 9, where the gate, the source and the drain of the transistor M8 are electrically coupled to the node 1, the sixth input IN6 and the node 9, respectively, where the gate, the source and the drain of the transistor M9 are electrically coupled to the node 14, the sixth input IN6 and a node 8 that is electrically coupled to the node 9, respectively, and where the gate, the source and the drain of the transistor M11 are electrically coupled to the forth input IN4, the sixth input IN6 and a node 11 that is electrically coupled to the node 9, respectively, (e) a second discharge transistor M10 having a gate electrically coupled to the node 8, a source electrically coupled to the sixth input IN6 and a drain electrically coupled to a node 10, respectively, where the node 10 is electrically coupled to the node 5, (f) a pull-up transistor M13 having a gate electrically coupled to the node 10, a source electrically coupled to a node 15 and a drain electrically coupled to a node 13, respectively, where the node 15 is electrically coupled to both the node 14 and the first output O1, and the node 13 is electrically coupled to the first input IN1, respectively, (g) a transistor M12 having a gate electrically coupled to the node 10, a source electrically coupled to the second output O2 and a drain electrically coupled to the node 13, respectively, and (h) a transistor M15 having a gate electrically coupled to the third input IN3, a source electrically coupled to the node 15 and a drain electrically coupled to the sixth input IN6, respectively. The j-th stage $S_j$, j=1, ... N, may also comprise a seventh input IN7, and a transistor M14 having a gate electrically coupled to the seventh input IN7, a source electrically coupled to the sixth input IN6 and a drain electrically coupled to the node 14, respectively. For the i-th stage $S_i$, i=1, ... N–1, the seventh input IN7 is adapted for receiving an output signal from its immediately next stage, $Si_{i+1}$. In one embodiment, each of the transistors M1-M15 comprises a field-effect thin film transistor.

In one embodiment, the pull-up transistor M13 is controllable by the first clock signal CLK1, and both the first discharge control circuit and the second discharge control circuit are controllable by the second clock signal CLK2.

In another aspect, the present invention relates to a shift register for generating a plurality of signals for sequentially driving a plurality of gate lines. In one embodiment, the shift register includes a plurality of stages, $\{S_j\}$, j=1, 2, ..., N, N being a positive integer. The j-th stage $S_j$ has a first to sixth inputs IN1 to IN6 and a first and second outputs O1 and O2 and further comprises (a) an input transistor M1 having a gate electrically coupled to the fifth input IN5, a source electrically coupled to a node 1 and a drain electrically coupled to a node 5, respectively, where the node 1 is electrically coupled to the fifth input IN5, (b) a first discharge transistor M5 having a gate electrically coupled to a node 4, a source electrically coupled to the sixth input IN6 and a drain electrically coupled to the node 5, respectively, (c) a first discharge control circuit 210 comprising transistors M2, M3, M4 and M6, each of the transistors M2, M3, M4 and M6 having a gate, a source and a drain, where both the gate and the drain of the transistor M2 are electrically coupled to the fourth input IN4, and the source of the transistor M2 is electrically coupled to a node 7, respectively, where the gate, the source and the drain of the transistor M3 are electrically coupled to the node 1, the sixth input IN6 and the node 7, respectively, where the gate, the source and the drain of the transistor M4 are electrically coupled to a node 14, the sixth input IN6 and a node 6 that is electrically coupled to both the node 7 and the node 4, respectively, and where the gate, the source and the drain of the transistor M6 are electrically coupled to the second input IN2, the sixth input IN6 and the node 4, respectively, (d) a second discharge control circuit 220 comprising transistors M7, M8, M9 and M11, each of the transistors M7, M8, M9 and M11 having a gate, a source and a drain, where both the gate and the drain of the transistor M7 are electrically coupled to the second input IN2, and the source of the transistor M7 is electrically coupled to a node 9, where the gate, the source and the drain of the transistor M8 are electrically coupled to the node 1, the sixth input IN6 and the node 9, respectively, where the gate, the source and the drain of the transistor M9 are electrically coupled to a node 14, the sixth input IN6 and a node 8 that is electrically coupled to the node 9, respectively, and where the gate, the source and the drain of the transistor M11 are electrically coupled to the forth input IN4, the sixth input IN6 and a node 11 that is electrically coupled to the node 9, respectively, (e) a second discharge transistor M10 having a gate electrically coupled to the node 8, a source electrically coupled to the sixth input IN6 and a drain electrically coupled to a node 10, respectively, where the node 10 is electrically coupled to the node 5, (f) a pull-up transistor M13 having a gate electrically coupled to the node 10, a source electrically coupled to a node 15 and a drain electrically coupled to a node 13, respectively, where the node 15 is electrically coupled to both the node 14 and the first output O1, and the node 13 is electrically coupled to the first input INi, respectively, (g) a transistor M12 having a gate electrically coupled to the node 10, a source electrically coupled to the second output O2 and a drain electrically coupled to the node 13, respectively, and (h) a transistor M15 having a gate electrically coupled to the third input IN3, a source electrically coupled to the node 15 and a drain electrically coupled to the sixth input IN6, respectively. The plurality of stages $\{S_j\}$ are electrically coupled in serial with that the fifth input IN5 of the first stage $S_1$ is electrically coupled to a start pulse input line for receiving a start pulse signal and the fifth input IN5 of the i-th stage $S_i$, i=2, 3, ... N, is electrically coupled to the second output O2 of its immediately prior stage, $S_{i-1}$, for receiving a corresponding output signal therefrom.

In one embodiment, each of the first to fourth inputs IN1 to IN4 of the j-th stage $S_j$ are adapted for receiving a corresponding signal of a first to fourth clock signals CLK1, CLK2, XCLK1 and XCLK2. Each of the first to fourth clock signals CLK1, CLK2, XCLK1 and XCLK2 is characterized with a frequency and a phase. The frequency of the first clock signal CLK1 is higher than the frequency of the second clock signal CLK2. In one embodiment, the frequency of the first clock signal CLK1 and the frequency of the third clock signal XCLK1 are substantially identical and the phase of the first clock signal CLK1 and the phase of the third clock signal XCLK1 are substantially reversed, and the frequency of the second clock signal CLK2 and the frequency of the fourth clock signal XCLK2 are substantially identical and the phase of the second clock signal CLK2 and the phase of the fourth clock signal XCLK2 are substantially reversed, respectively. The sixth input IN6 of the j-th stage $S_j$ is adapted for receiving a supply voltage, VSS.

The first output O1 of the j-th stage $S_j$ is adapted for providing a gate driving signal to a corresponding gate line responsive to the first to fourth clock signals CLK1, CLK2, XCLK1 and XCLK2 and an input signal received by the first to fifth inputs IN1 to IN5, respectively, where the gate driving signal is shifted from the input signal received by the fifth input IN5. The second output O2 of the j-th stage $S_j$ is adapted for providing an output signal having a frequency and a phase that are substantially same as those of the gate driving signal, respectively.

In one embodiment the pull-up transistor M13 of the j-th stage $S_j$ is controllable by the first clock signal CLK1, and both the first discharge control circuit 210 and the second discharge control circuit 220 of the j-th stage $S_j$ are controllable by the second clock signal CLK2.

The j-th stage $S_j$, j=1, ... N, may also comprise a seventh input IN7, and a transistor M14 having a gate electrically coupled to the seventh input IN7, a source electrically coupled to the sixth input IN6 and a drain electrically coupled to the node 14, respectively. For the i-th stage $S_i$, i=1, ... N−1, the seventh input IN7 is adapted for receiving an output signal from its immediately next stage, $S_{i+1}$.

In yet another aspect, the present invention relates to a method for driving a shift register, the shift register having a plurality of stages, $\{S_j\}$, j=1, 2, ..., N, N being a positive integer, electrically coupled in serial. In one embodiment, the method includes the steps of providing the first stage $S_1$ a start pulse, SP, providing the plurality of stages $\{S_j\}$ a first pair of clock signals, CLK1 and XCLK1, with a first frequency, $f_1$, providing the plurality of stages $\{S_j\}$ a second pair of clock signals, CLK2 and XCLK2, with a second frequency, $f_2$, where the second frequency $f_2$ is different from the first frequency $f_1$, and generating a plurality of signals responsive to the start pulse signal, the first pair of clock signals, CLK1 and XCLK1, and the second pair of clock signals SP, CLK2 and XCLK2, where each of the plurality of signals is sequentially shifted from the start pulse signal SP. In one embodiment, the first frequency $f_1$ is higher than the second frequency $f_2$. For the first pair of clock signals CLK1 and XCLK1, the phase of clock signal CLK1 is substantially reversed from the phase of clock signal XCLK1. For the second pair of clock signals CLK2 and XCLK2, the phase of clock signal CLK2 is substantially reversed from the phase of clock signal XCLK2.

In a further aspect, the present invention relates to a shift register. In one embodiment, the shift register has means for providing a first pair of clock signals, CLK1 and XCLK1, with a first frequency, $f_1$, and a second pair of clock signals, CLK2 and XCLK2, with a second frequency, $f_2$, where the second frequency $f_2$ is different from the first frequency $f_1$, and means for generating a plurality of signals responsive to a start pulse signal, the first pair of clock signals CLK1 and XCLK1, and the second pair of clock signals CLK2 and XCLK2, where each of the plurality of signals is sequentially shifted from the start pulse signal. In one embodiment, the first frequency f, is higher than the frequency of the second frequency $f_2$. For the first pair of clock signals CLK1 and XCLK1, the phase of clock signal CLK1 is substantially reversed from the phase of clock signal XCLK1. For the second pair of clock signals CLK2 and XCLK2, the phase of clock signal CLK2 is substantially reversed from the phase of clock signal XCLK2.

In one embodiment, the providing means includes a phase-delayed clock signal generator. The generating means includes a plurality of stages. Each stage has a first to fifth inputs IN1 to IN5, where each of the first to fifth inputs IN1 to IN5 is adapted for receiving one of the first pair of clock signals CLK1 and XCLK1, the second pair of clock signals CLK2 and XCLK2 and an input signal. Furthermore, each stage has a first output O1 for outputting a gate driving signal responsive to the clock signals CLK1, CLK2, XCLK1 and XCLK2 and the input signal, and a second output O2 for outputting an output signal having a frequency and a phase that are substantially same as those of the gate driving signal, respectively. In one embodiment, the plurality of stages are electrically coupled in serial such that the fifth input IN5 of a first stage is electrically coupled to a start pulse input line for receiving a start pulse signal and the fifth input IN5 of each of the rest of the plurality of stage is electrically coupled to the second output O2 of its immediately prior stage for receiving an output signal therefrom.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and, together with the written description, serve to explain the principles of the invention. Wherever possible, the same reference numbers are used throughout the drawings to refer to the same or like elements of an embodiment, and wherein.

DETAILED DESCRIPTION OF THE INVENTION

Figure 1:
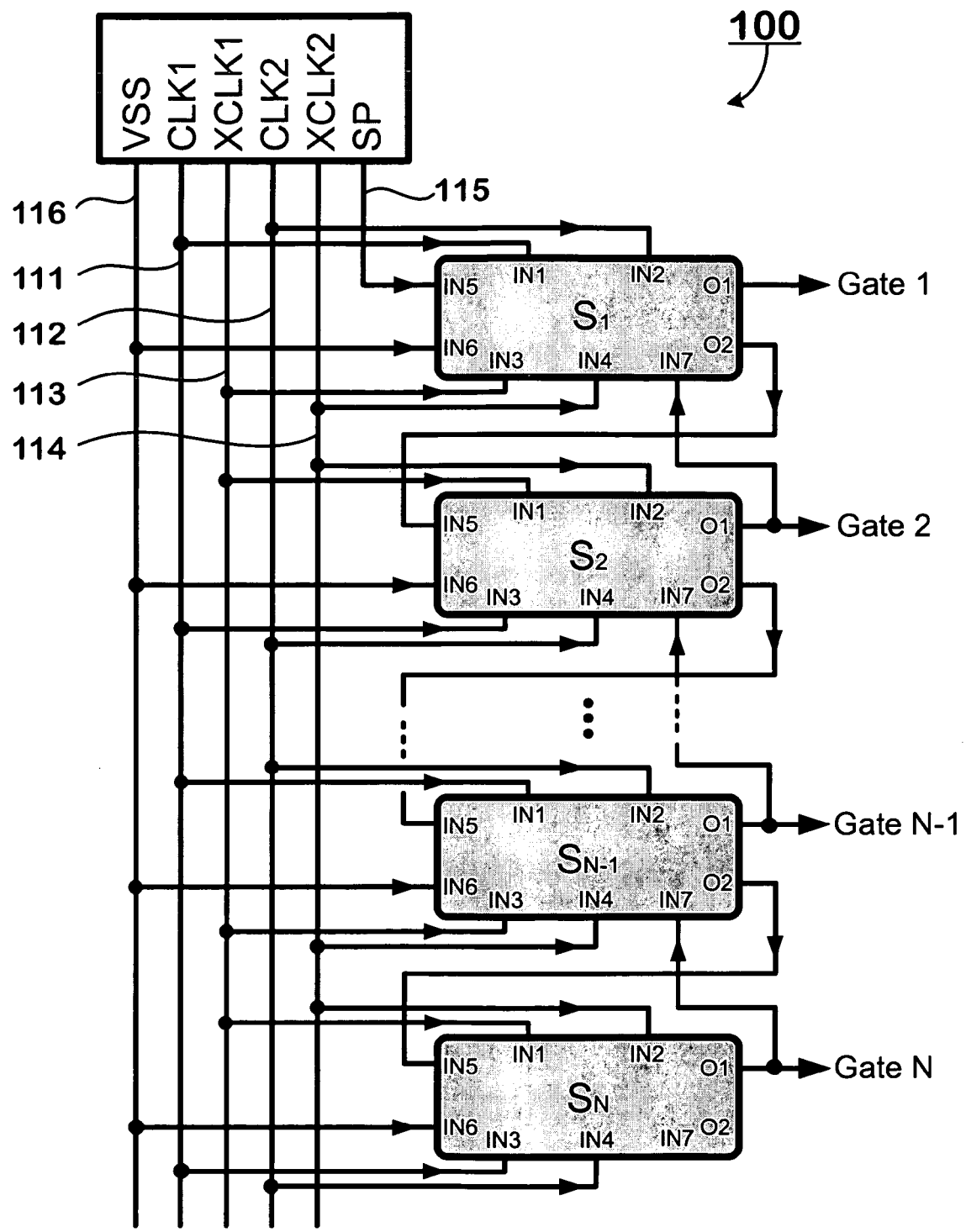
FIG. 1 shows a block diagram of a shift register according to one embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise.

The description will be made as to the embodiments of the present invention in conjunction with the accompanying drawings in FIGS. 1-4. In accordance with the purposes of this invention, as embodied and broadly described herein, this invention, in one aspect, relates to a shift register with four phase clocks.

Figure 2:
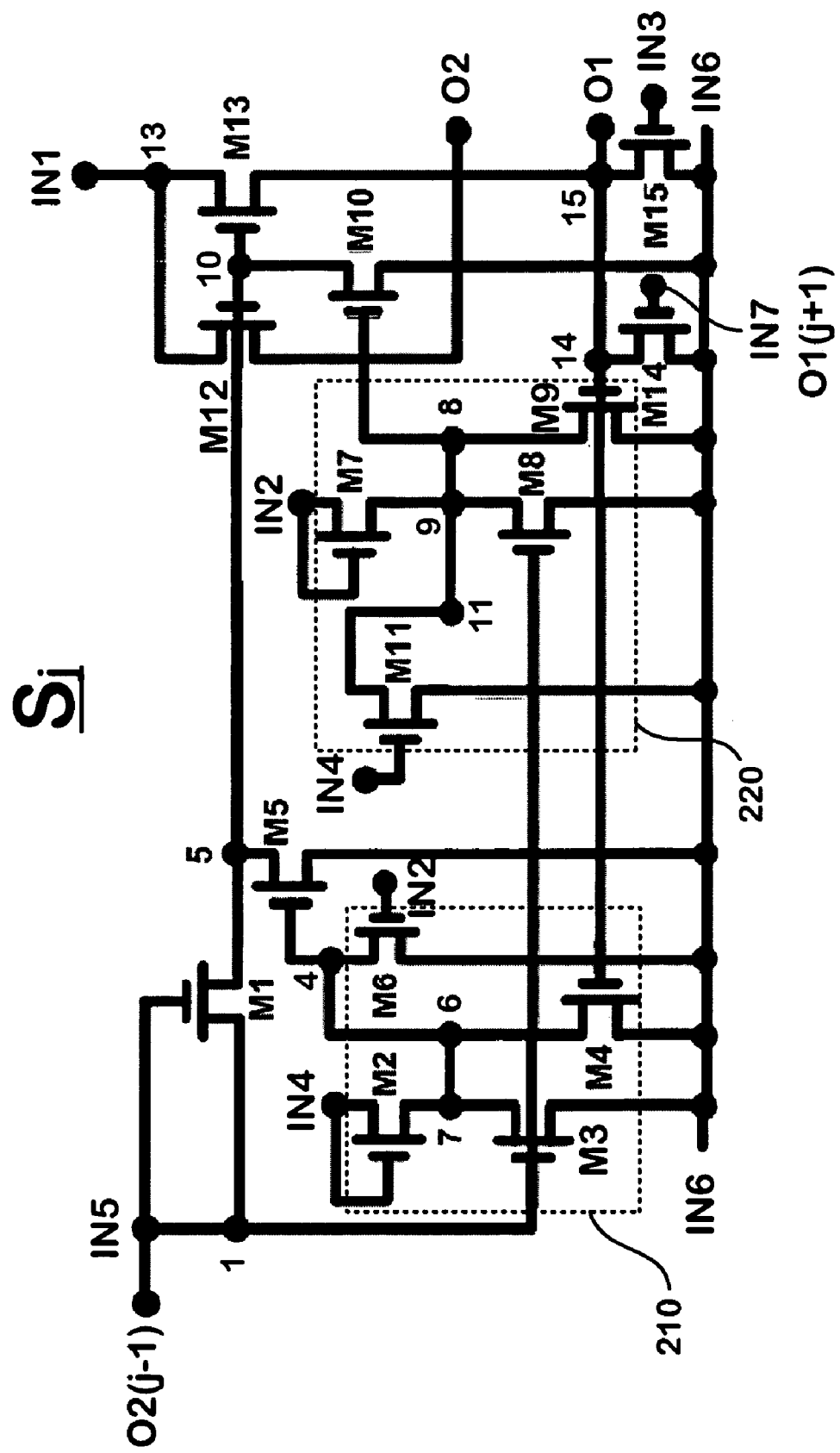
FIG. 2 shows a circuit diagram of a stage of a shift register according to one embodiment of the present invention.

Referring in general to FIGS. 1 and 2, and in particular to FIG. 1 first, a shift register 100 is shown according to one embodiment of the present invention. The shift register 100 includes a start pulse input line 115 for providing a start pulse, SP, a first signal line 111 for providing a first clock signal, CLK1, a second signal line 112 for providing a second clock signal, CLK2, a third signal line 113 for providing a third clock signal, XCLK1, and a fourth signal line 114 for providing a fourth clock signal, XCLK2. Furthermore, the shift register 100 includes a reference line 116 for providing a supply voltage, VSS.

Each of the first to fourth clock signals CLK1, CLK2, XCLK1 and XCLK2 is characterized with a frequency and a phase. The frequency of the first clock signal CLK1 and the frequency of the third clock signal XCLK1 are substantially identical and the phase of the first clock signal CLK1 and the phase of the third clock signal XCLK1 are substantially reversed. The frequency of the second clock signal CLK2 and the frequency of the fourth clock signal XCLK2 are substantially identical and the phase of the second clock signal CLK2 and the phase of the fourth clock signal XCLK2 are substantially reversed, respectively. In a preferable embodiment, the frequency of the first clock signal CLK1 is higher than the frequency of the second clock signal CLK2. The voltage VSS is supplied to the ground, and thus can be a ground voltage or a negative voltage.

As shown in FIG. 1, the shift register 100 further includes a plurality of stages, $\{S_j\}$, j=1, 2, ..., N, N being a positive integer. The j-th stage $S_j$ has a first to seventh inputs, IN1 to IN7. For the first stage S1, the first input IN1 is electrically coupled to the first signal line 111 for receiving the first clock signal CLK1. The second input IN2 is electrically coupled to the second signal line 112 for receiving the second clock signal CLK2. The third input IN3 is electrically coupled to the third signal line 113 for receiving the third clock signal XCLK1. The fourth input IN4 is electrically coupled to the fourth signal line 114 for receiving the fourth clock signal XCLK2. While for the second stage $S_2$, the first input IN1 is electrically coupled to the third signal line 113 for receiving the third clock signal XCLK1. The second input IN2 is electrically coupled to the fourth signal line 114 for receiving the fourth clock signal XCLK2. The third input IN3 is electrically coupled to the first signal line 111 for receiving the first clock signal CLK1. The fourth input IN4 is electrically coupled to the second signal line 112 for receiving the second clock signal CLK2. In general, for the j-th stage $S_j$, if j is an odd number, the first to fourth inputs IN1 to IN4 are electrically coupled to the first, second, third and fourth signal lines 111, 112, 113 and 114 for receiving the first, second, third and fourth clock signals CLK1, CLK2, XCLK1 and XCLK2, respectively, while if j is an even number, the first to fourth inputs IN1 to IN4 are electrically coupled to the third, fourth, first and second signal lines 113, 114, 111 and 112 for receiving the third, fourth, first and second clock signal XCLK1, XCLK2, CLK1 and CLK2, respectively.

For each stage, the fifth input IN5 is adapted for receiving an input signal. And the sixth input IN6 is electrically coupled to the reference line 116 for receiving the supply voltage VSS. The seventh input IN7 is electrically coupled to an output of its immediately next stage for receiving an output signal therefrom.

The j-th stage $S_j$ also has a first output O1 and a second output O2. The first output O1 of a stage is electrically coupled to a corresponding gate, Gate 1, Gate 2, ... or Gate N, for providing a gate driving signal to the gate responsive to the input signal and the first to fourth clock signals CLK1, CLK2, XCLK1 and XCLK2, where the gate driving signal is shifted from the input signal. The first output O1 is also electrically coupled to the seventh input 1N7 of its immediately prior stage for providing a feedback signal. The second output O2 is adapted for providing an output signal. The output signal has a frequency and a phase that are substantially same as those of the gate driving signal, respectively. For example, the first output O1 of the first stage S1 is electrically coupled to a first gate, Gate 1, and the second output O2 of the first stage S1 is adapted for providing an output signal to the next stage, $S_2$, the second stage. In the second stage $S_2$, the first output O1 is electrically coupled not only to a second gate, Gate 2, and but also to the seventh input IN7 of the stage $S_1$ for providing the output signal of the second stage $S_2$ as a feedback signal to the first stage S1, and the second output O2 of the first stage $S_2$ is adapted for providing an output signal to the next stage, $S_3$, the third stage.

Referring now to FIG. 2, the j-th stage $S_j$ further has an input transistor M1 having a gate electrically coupled to the fifth input IN5, a source electrically coupled to a node 1 and a drain electrically coupled to a node 5, respectively, where the node 1 is electrically coupled to the fifth input IN5. For the first stage $S_1$ the fifth input INS is electrically coupled to the start pulse input line 115 for receiving the start pulse SP, while for each of the rest of the stage, $S_j$, (j=2, 3, ... N), the fifth input INS is electrically coupled to the second output $O2(j-1)$ of its immediately prior stage, $S_{j-1}$ for receiving the output signal therefrom. Furthermore, the j-th stage $S_j$ has a first discharge transistor MS having a gate electrically coupled to a node 4, a source electrically coupled to the sixth input IN6 and a drain electrically coupled to the node 5, respectively, and a second discharge transistor M10 having a gate electrically coupled to a node 8, a source electrically coupled to the sixth input IN6 and a drain electrically coupled to a node 10, respectively, where the node 10 is electrically coupled to the node S.

Moreover, the j-th stage $S_j$ has a first discharge control circuit 210 comprising transistors M2, M3, M4 and M6. Each of the transistors M2, M3, M4 and M6 has a gate, a source and a drain. As shown in FIG. 2, both the gate and the drain of the transistor M2 are electrically coupled to the fourth input IN4, and the source of the transistor M2 is electrically coupled to a node 7, respectively. The gate, the source and the drain of the transistor M3 are electrically coupled to the node 1, the sixth input IN6 and the node 7, respectively. The gate, the source and the drain of the transistor M4 are electrically coupled to a node 14, the sixth input IN6 and a node 6 that is electrically coupled to both the node 7 and the node 4, respectively. And the gate, the source and the drain of the transistor M6 are electrically coupled to the second input IN2, the sixth input IN6 and the node 4, respectively.

Additionally, the j-th stage $S_j$ has a second discharge control circuit 220 comprising transistors M7, M8, M9 and M11. Each of the transistors M7, M8, M9 and M11 has a gate, a source and a drain. As shown in FIG. 2, both the gate and the drain of the transistor M7 are electrically coupled to the second input IN2, and the source of the transistor M7 is electrically coupled to a node 9. The gate, the source and the drain of the transistor M8 are electrically coupled to the node 1, the sixth input IN6 and the node 9, respectively. The gate, the source and the drain of the transistor M9 are electrically coupled to the node 14, the sixth input IN6 and the node 8 that is electrically coupled to the node 9, respectively. And the gate, the source and the drain of the transistor M1 I are electrically coupled to the forth input IN4, the sixth input IN6 and a node 11 that is electrically coupled to the node 9, respectively.

As shown in FIG. 2, the j-th stage $S_j$ also includes a pull-up transistor M13 having a gate electrically coupled to the node 10, a source electrically coupled to a node 15 and a drain electrically coupled to a node 13, respectively, where the node 15 is electrically coupled to both the node 14 and the first output O1, and the node 13 is electrically coupled to the first input INi, respectively. The j-th stage $S_j$ further includes a transistor M12 having a gate electrically coupled to the node 10, a source electrically coupled to the second output O2 and a drain electrically coupled to the node 13, respectively, and a transistor M15 having a gate electrically coupled to the third input IN3, a source electrically coupled to the node 15 and a drain electrically coupled to the sixth input IN6, respectively. In a preferable embodiment, the pull-up transistor M13 is controllable by the first clock signal CLK1, and both the first discharge control circuit 210 and the second discharge control circuit 220 are controllable by the second clock signal CLK2.

The j-th stage $S_j$ may further include a seventh input IN7, and a transistor M14 having a gate electrically coupled to the seventh input IN7, a source electrically coupled to the sixth input IN6 and a drain electrically coupled to the node 14, respectively. For each of the first to (N−1)-th stages, $S_j$, (j=1, ... N−1), the seventh input IN7 is electrically coupled to the second output O1(j+1) of its immediately next stage the (j+1)-th stage $S_{j+1}$ for receiving an output signal therefrom.

Preferably, at least one of the transistors M1-M15 comprises a field-effect TFT. Other types of TFTs can also be used to practice the current invention.

An operation procedure of the shift register will be described with reference to driving waveforms illustrated in FIG. 3.

Referring back to FIG. 1, the plurality of stages $\{S_j\}$ are electrically coupled in serial with that the fifth input IN5 of the first stage S1 is electrically coupled to the start pulse input line 115 for receiving the start pulse SP and the fifth input IN5 of the i-th stage Si, i=2, 3, ... N, is electrically coupled to the second output O2 of its immediately prior stage, Si−1, for receiving a corresponding output signal therefrom. For example, the fifth input IN5 of the second stage, $S_2$, is electrically coupled to the second output O2 of its immediately prior stage, SI, the first stage, for receiving output signal therefrom.

Figure 3:
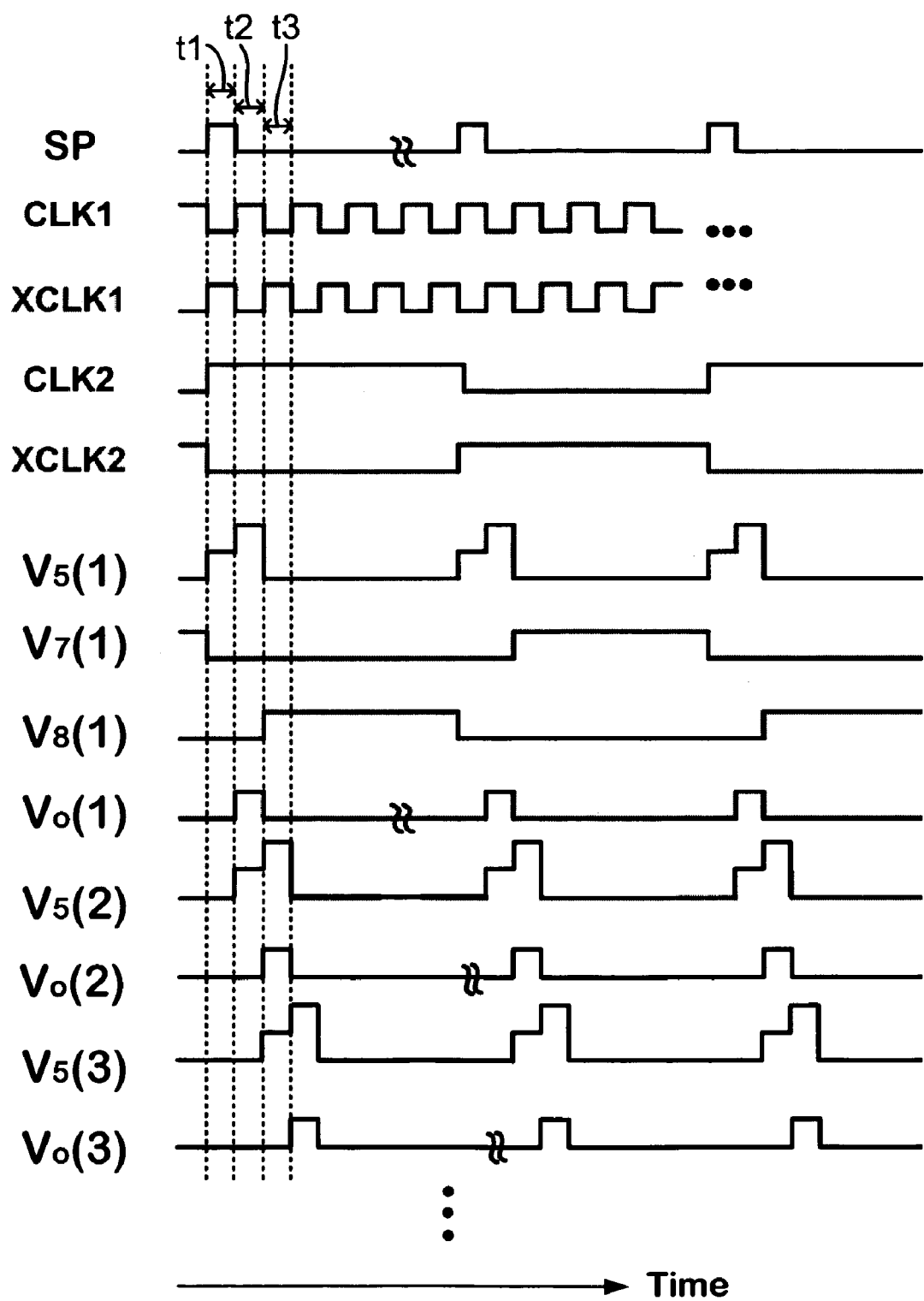
FIG. 3 shows a timing chart of input and output signals of a shift register according to one embodiment of the present invention.

Referring now to FIG. 3, a timing chart of input and output signals of the shift register at the first, second and third stages $S_1$, $S_2$ and $S_3$ is shown according to one embodiment of the present invention. In this chart, $V_0(1)$, $V_0(2)$ and $V_0(3)$ represent an output voltage (signal) from the first, second and third stages $S_1$, $S_2$ and $S_3$, respectively. $V_5(1)$, $V_7(1)$ and $V_8(1)$ are corresponding to a voltage at the nodes 5, 7, and 8 of the first stage $S_1$, respectively. While $V_5(2)$ and $V_5(3)$ are corresponding to voltages of the node 5 of the second and third stages $S_2$ and $S_3$, respectively. The start pulse is indicated by SP. The first to fourth clock signals are represented by CLK1, CLK2, XCLK1 and XCLK2, respectively. As shown in FIG. 3, the frequency of the first clock signal CLK1 is higher than the frequency of the second clock signal CLK2. The frequency of the first clock signal CLK1 and the frequency of the third clock signal XCLK1 are substantially identical and the phase of the first clock signal CLK1 and the phase of the third clock signal XCLK1 are substantially reversed. The frequency of the second clock signal CLK2 and the frequency of the fourth clock signal XCLK2 are substantially identical and the phase of the second clock signal CLK2 and the phase of the fourth clock signal XCLK2 are substantially reversed, respectively. In one embodiment for example, for a 17" LCD panel with a frame rate of 75 Hz, the first and third clock signals CLK1 and XCLK1 having a pulse width of 12.5 µs, and the second and the fourth clock signals CLK2 and XCLK2 having a pulse width not less than N times of 13.3 ms can be employed to practice the current invention, where N is the total number of the stages.

In operation, the first to fourth clock signals, CLK1, CLK2, XCLK1 and XCLK2, and the start pulse SP are synchronized. The first to fourth clock signals, CLK1, CLK2, XCLK1 and XCLK2 are applied to each stage, while the start pulse SP is applied to the first stage $S_1$ only. As shown in FIG. 1, in a first interval of time, t1, the start pulse signal SP has a high voltage, which is in synchronization with a high voltage of the second and third clock signals CLK2 and XCLK1, and a low voltage of the first and fourth clock signals CLK1 and XCLK2, respectively. In the first stage $S_1$, the first to fifth inputs IN1 to IN5 receive the first to fourth clock signals CLK1, CLK2, XCLK1 and XCLK2 and the start pulse SP, respectively. As a result, the transistors M1, M3 and M8 are turned on by the high voltage of the start pulse signal SP. The high voltage of the start pulse signal SP is then applied to the node 5, thereby pre-charging the node 5 to have the signal $V_5(1)$ with a high voltage, while the voltage signal $V_7(1)$ at the node 7 and the voltage signal $V_8(1)$ at the node 8 are discharged into the ground through the sixth input IN6, so that the voltage signals $V_7(1)$ and $V_8(1)$ have a low voltage in the first interval of time t1. Meanwhile, the high voltage of the signal $V_5(1)$ pre-charged into the node 5 turns on the transistor M10 and M13, thereby applying the low voltage of the first clock signal CLK1 to the first and second outputs O1 and O2, which leads to a low voltage of the output signal $V_0((1)$ in the first interval of time t1. Additionally, the transistors M6 and M7 and the transistor M15 are turned on by the high voltage of the second and third clock CLK2 and XCLK1, respectively. The transistors M2 and M11 are in its turn-off state since the fourth clock signal XCLK2 has a low voltage in the first interval of time t1.

In the second stage $S_2$, the low voltage of the output signal $V_0(1)$ of the first stage $S_1$ in the first interval of time t1 is input into the fifth input IN5 of the second stage $S_2$. While the first to fourth inputs IN1 to IN5 receive the third, fourth, first and second clock signals XCLK1, XCLK2, CLK1 and CLK2, respectively. These signals causes the second stage $S_2$ to output an output signal $V_0(2)$ at a low voltage in the first interval of time t1. Accordingly, the third to N-th stages also output a low voltage of output signals.

In a second interval of time, t2, the start pulse signal SP is inverted to a low voltage and the first clock signal CLK1 has a high voltage. Accordingly, in the first stage S1, the transistors M1, M3 and M8 are turned off by the low voltage of the start pulse signal SP. However, the transistors M12 and M13 are still turned on by the voltage signal $V_5(1)$ at the node 5, thereby passing the high voltage of the first clock signal CLK1 to the first and second outputs O1 and O2, which leads to a high voltage of the output signal $V_0(1)$ in the second interval of time t2. Meanwhile, the voltage signal $V_5(1)$ at the node 5 is bootstrapped to a higher voltage level. Additionally, the transistor M6 is turned on by the high voltage of the second clock signal CLK2, which causes the voltage signal $V_7(1)$ at the node 7 to be discharged into the ground voltage VSS through the sixth input IN6. The high voltage of the second clock signal CLK2 also turns on the transistor M7 and therefore charges the node 9 into a high voltage. Furthermore, the high voltage of the output signal $V_0(1)$ at the first output O1 turns on the transistor M9. Consequently, the voltage signal $V_8(1)$ at the node 8 (or the node 9) is discharged into the ground voltage VSS through the sixth input IN6.

In the second stage $S_2$, the high voltage of the output signal $V_0(1)$ of the first stage $S_1$ in the second interval of time t2 is input into the second stage $S_2$ via the fifth input IN5, thereby causing the transistors M1, M3 and M8 to turn on. As a result, the high voltage of the output signal $V_0((1)$ of the first stage $S_1$ in the second interval of time t2 is applied to the node 5 of the second stage $S_2$, thus pre-charging the node 5 of the second stage $S_2$ to have the signal $V_5(2)$ with a high voltage. Meanwhile, the high voltage of the signal $V_5(2)$ pre-charged into the node 5 turns on the transistor M10 and M13 of the second stage $S_2$, thereby causing the low voltage of the third clock signal XCLK1 to pass through the first and second outputs O1 and O2, which leads to a low voltage of the output signal $V_0(2)$ of the second stage $S_2$ in the second interval of time t2. The low voltage of the output signal $V_0(2)$ in the second interval of time t2 is input to the third stage $S_3$, thereby causing the third stage $S_3$ to output an output signal $V_0(3)$ at a low voltage in the second interval of time t2. And so on, the fourth to N-th stages also output a low voltage of output signals in second interval of time t2.

In a third interval of time, t3, the start pulse signal SP is still in a low voltage, while the first clock signal CLK1 and the third clock signal XCLK1 are inverted to a low voltage and high voltage, respectively. Therefore, in the first stage S1, the output signal $V_0(1)$ is still in a low voltage. The transistor M14 is turned on by the high voltage of the output signal $V_0(2)$ of the second stage $S_2$ so that the voltage signal at the node 14 is discharged into the ground voltage VSS through the sixth input IN6, which turns off the transistor M9. Meanwhile, the transistor M7 is still turned on by the high voltage of the second clock signal CLK2, thereby charging the node 9 and the node 8 into a high voltage. Thus, the voltage signal $V_8(1)$ at the node 8 has a high voltage in the third interval of time t3. The high voltage of the voltage signal $V_8(1)$ turns on the transistor M10, which causes the voltage signal at the node 10, and thus $V_5(1)$ at the node 5, to be discharged into the ground voltage VSS through the sixth input IN6. For the node 7, the voltage signal $V_7(1)$ is still in the low voltage since the transistor M2 is still turned off by the low voltage of the fourth clock signal XCLK2.

In the second stage $S_2$, the first input INi receives the high voltage of the third clock signal XCLK1 and the fifth input IN5 receives the output signal $V_0(1)$ of the first stage $S_1$ with a low voltage. Accordingly, the transistors M1, M3 and M8 are turned off by the low voltage of the output signal $V_0(1)$. However, the transistors M12 and M13 are still turned on by the voltage signal $V_5(2)$ at the node 5, thereby passing the high voltage of the third clock signal XCLK1 to the first and second outputs O1 and O2, which leads to a high voltage of the output signal $V_0(2)$ in the third interval of time t3. Meanwhile, the voltage signal $V_5(2)$ at the node 5 is bootstrapped to a higher voltage level.

In the third stage $S_3$, the first input IN1 receives the low voltage of the first clock signal CLK1 and the fifth input IN5 receives the high voltage of the output signal $V_0(2)$ of the second stage S2. As a result, the high voltage of the output signal $V_0(2)$ turns on the transistor M1 and then is applied to the node 5, thereby pre-charging the node 5 to have the signal $V_5(3)$ with a high voltage. Meanwhile, the high voltage of the signal $V_5(3)$ pre-charged into the node 5 turns on the transistor M10 and M13, thereby applying the low voltage of the first clock signal CLK1 to the first and second outputs O1 and O2, which leads to a low voltage of the output signal $V_0(3)$ in the third interval of time t3. For the rest of the stages, the output signals are in a low voltage.

As described above, each stage of the shift register according to one embodiment of the present invention sequentially shifts the start pulse SP by a scanning period. To this end, the N output lines of the shift register are sequentially enabled and furthermore the gate lines, Gate 1, Gate 2, . . . and Gate N, of an LCD panel are sequentially driven.

Figure 4:
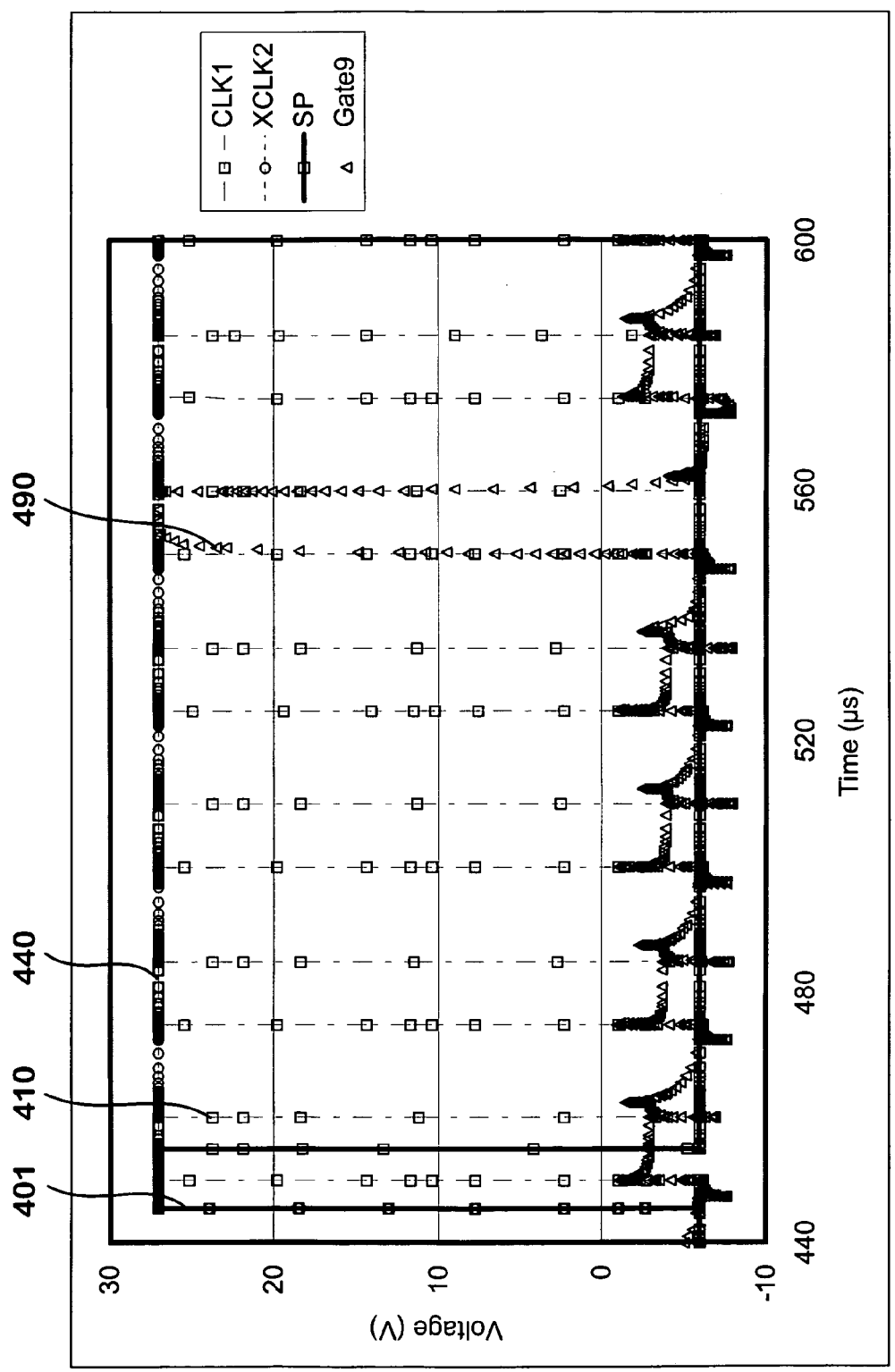
FIG. 4 shows simulated waveforms of output signals of a shift register according to one embodiment of the present invention.

Referring to FIG. 4, a simulation result of the output signal 490 from the ninth stage of the shift register is shown according to one embodiment of the present invention. In the simulation, the first and fourth clock signals CLK1 410 and XCLK2 440 are assumed to have frequencies of 40 KHz and 37.5 Hz, and the start pulse SP 401 has a frequency of 75 Hz and a pulse width of 10 µs. The simulation result clearly shows that the output voltage 490 of the ninth stage is shifted from the start pulse SP by nine times of the pulse width of the start pulse SP.

Another aspect of the present invention provides a shift register having means for providing a first pair of clock signals, CLK1 and XCLK1, with a first frequency, $f_1$, and a second pair of clock signals, CLK2 and XCLK2, with a second frequency, $f_2$, and means for generating a plurality of signals responsive to a start pulse signal, the first pair of clock signals CLK1 and XCLK1, and the second pair of clock signals CLK2 and XCLK2, where each of the plurality of signals is sequentially shifted from the start pulse signal. Preferably, the first frequency $f_1$ is higher than the frequency of the second frequency $f_2$. For the first pair of clock signals CLK1 and XCLK1, the phase of clock signal CLK1 is substantially reversed from the phase of clock signal XCLK1. For the second pair of clock signals CLK2 and XCLK2, the phase of clock signal CLK2 is substantially reversed from the phase of clock signal XCLK2.

The providing means includes a phase-delayed clock signal generator. The generating means includes a plurality of stages. Each stage has a first to fifth inputs IN1 to IN5 with each adapted for receiving one of the first pair of clock signals CLK1 and XCLK1, the second pair of clock signals CLK2 and XCLK2 and an input signal. Each stage further has a first output O1 for outputting a gate driving signal responsive to the clock signals CLK1, CLK2, XCLK1 and XCLK2 and the input signal, and a second output O2 for outputting an output signal having a frequency and a phase that are substantially same as those of the gate driving signal, respectively. The plurality of stages are electrically coupled in serial such that the fifth input IN5 of a first stage is electrically coupled to a start pulse input line for receiving a start pulse signal and the fifth input IN5 of each of the rest of the plurality of stage is electrically coupled to the second output O2 of its immediately prior stage for receiving an output signal therefrom.

Yet anther aspect of the present invention relates to a method for driving a shift register, the shift register having a plurality of stages, $\{S_j\}$, j=1, 2, . . . , N, N being a positive integer, electrically coupled in serial. In one embodiment, the method includes the steps of providing the first stage $S_1$ a start pulse SP, providing the plurality of stages $\{S_j\}$ a first pair of clock signals, CLK1 and XCLK1, with a first frequency, $f_1$, providing the plurality of stages $\{S_j\}$ a second pair of clock signals, CLK2 and XCLK2, with a second frequency, $f_2$, wherein the second frequency $f_2$ is different from the first frequency $f_1$, and generating a plurality of signals responsive to a start pulse signal, the first pair of clock signals, CLK1 and XCLK1, and the second pair of clock signals, CLK2 and XCLK2, wherein each of the plurality of signals is sequentially shifted from the start pulse signal. In one embodiment, the first frequency $f_1$ is higher than the second frequency $f_2$. For the first pair of clock signals CLK1 and XCLK1, the phase of clock signal CLK1 is substantially reversed from the phase of clock signal XCLK1. For the second pair of clock signals CLK2 and XCLK2, the phase of clock signal CLK2 is substantially reversed from the phase of clock signal XCLK2.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A shift register, comprising:
   a. a start pulse input line for providing a start pulse;
   b. a first signal line for providing a first clock signal;
   c. a second signal line for providing a second clock signal;
   d. a third signal line for providing a third clock signal;
   e. a fourth signal line for providing a fourth clock signal; and
   f. a plurality of stages, $\{S_j\}$, j=1, 2, . . . , N, N being a positive integer, wherein the j-th stage $S_j$ comprises:
      (i). a first to fourth inputs, wherein when j is an odd number, the first to fourth inputs are electrically coupled to the first, second, third and fourth signal lines for receiving the first, second, third and fourth clock signals, respectively, and when j is an even number, the first to fourth inputs are electrically coupled to the third, fourth, first and second signal lines for receiving the third, fourth, first and second clock signal, respectively;
      (ii). a fifth input for receiving an input signal;
      (iii). a first output electrically coupled to a corresponding gate for providing a gate driving signal to the gate responsive to the input signal and the first to fourth clock signals, wherein the gate driving signal is shifted from the input signal; and
      (iv). a second output for providing an output signal having a frequency and a phase that are substantially same as those of the gate driving signal, respectively, wherein the plurality of stages $\{S_j\}$ are electrically coupled in serial such that the fifth input of the first stage $S_1$ is electrically coupled to the start pulse input line for receiving the start pulse, and the fifth input of the i-th stage $S_i$, i=2, 3, . . . N, is electrically coupled to the second output of the (i−1)-th stage $S_{i-1}$, for receiving a corresponding output signal therefrom, wherein each of the first to fourth clock signals is characterized with a frequency and a phase, wherein the frequency of the first clock signal and the frequency of the third clock signal are substantially identical and the phase of the first clock signal and the phase of the third clock signal are substantially reversed, and wherein the frequency of the second clock signal and the frequency of the fourth clock signal are substantially identical and the phase of the second clock signal and the phase of the fourth clock signal are substantially reversed, respectively, and wherein the frequency of the first clock signal is higher than the frequency of the second clock signal.

2. The shift register of claim 1, further comprising a reference line for providing a supply voltage to the j-th stage $S_j$, j=1, 2, . . . N.

3. The shift register of claim 2, wherein the j-th stage $S_j$, j=1, 2, . . . N, further comprises a sixth input electrically coupled to the reference line for receiving the supply voltage.

4. The shift register of claim 3, wherein the j-th stage $S_j$ further comprises:
   a. an input transistor M1 having a gate electrically coupled to the fifth input, a source electrically coupled to a node 1 and a drain electrically coupled to a node 5, respectively, wherein the node 1 is electrically coupled to the fifth input;
   b. a first discharge transistor M5 having a gate electrically coupled to a node 4, a source electrically coupled to the sixth input and a drain electrically coupled to the node 5, respectively;
   c. a first discharge control circuit comprising transistors M2, M3, M4 and M6, each of the transistors M2, M3, M4 and M6 having a gate, a source and a drain,
      wherein both the gate and the drain of the transistor M2 are electrically coupled to the fourth input, and the source of the transistor M2 is electrically coupled to a node 7, respectively;
      wherein the gate, the source and the drain of the transistor M3 are electrically coupled to the node 1, the sixth input and the node 7, respectively;
      wherein the gate, the source and the drain of the transistor M4 are electrically coupled to a node 14, the sixth input and a node 6 that is electrically coupled to both the node 7 and the node 4, respectively; and
      wherein the gate, the source and the drain of the transistor M6 are electrically coupled to the second input, the sixth input and the node 4, respectively;
   d. a second discharge control circuit comprising transistors M7, M8, M9 and M11, each of the transistors M7, M8, M9 and M11 having a gate, a source and a drain,
      wherein both the gate and the drain of the transistor M7 are electrically coupled to the second input, and the source of the transistor M7 is electrically coupled to a node 9;
      wherein the gate, the source and the drain of the transistor M8 are electrically coupled to the node 1, the sixth input and the node 9, respectively;
      wherein the gate, the source and the drain of the transistor M9 are electrically coupled to the node 14, the sixth input and a node 8 that is electrically coupled to the node 9, respectively; and
      wherein the gate, the source and the drain of the transistor M11 are electrically coupled to the forth input IN4, the sixth input and a node 11 that is electrically coupled to the node 9, respectively;
   e. a second discharge transistor M10 having a gate electrically coupled to the node 8, a source electrically coupled to the sixth input and a drain electrically coupled to a node 10, respectively, wherein the node 10 is electrically coupled to the node 5;
   f. a pull-up transistor M13 having a gate electrically coupled to the node 10, a source electrically coupled to a node 15 and a drain electrically coupled to a node 13, respectively, wherein the node 15 is electrically coupled to both the node 14 and the first output, and the node 13 is electrically coupled to the first input, respectively;

g. a transistor M12 having a gate electrically coupled to the node 10, a source electrically coupled to the second output and a drain electrically coupled to the node 13, respectively; and h. a transistor M15 having a gate electrically coupled to the third input, a source electrically coupled to the node 15 and a drain electrically coupled to the sixth input, respectively.

5. The shift register of claim 4, wherein the j-th stage $S_j$, j=1, 2, ... N, further comprises:

a. a seventh input; and b. a transistor M14 having a gate electrically coupled to the seventh input, a source electrically coupled to the sixth input and a drain electrically coupled to the node 14, respectively.

6. The shift register of claim 5, wherein for the i-th stage Si, i=1, ... N−1, the seventh input of the stage Si is adapted for receiving an output signal from its immediately next stage Si+1.

7. The shift register of claim 5, wherein at least one of the transistors M1-M15 comprises a field-effect thin film transistor.

8. The shift register of claim 4, wherein the pull-up transistor M13 is controllable by the first clock signal.

9. The shift register of claim 8, wherein both the first discharge control circuit and the second discharge control circuit are controllable by the second clock signal.

10. A shift register for generating a plurality of signals for sequentially driving a plurality of gate lines, comprising a plurality of stages, $\{S_j\}$, j=1, 2, ..., N, N being a positive integer, wherein the j-th stage $S_j$ comprises:

a. a first to sixth inputs;

b. a first and second outputs;

c. an input transistor M1 having a gate electrically coupled to the fifth input, a source electrically coupled to a node 1 and a drain electrically coupled to a node 5, respectively, wherein the node 1 is electrically coupled to the fifth input;

d. a first discharge transistor M5 having a gate electrically coupled to a node 4, a source electrically coupled to the sixth input and a drain electrically coupled to the node 5, respectively;

e. a first discharge control circuit comprising transistors M2, M3, M4 and M6, each of the transistors M2, M3, M4 and M6 having a gate, a source and a drain, wherein both the gate and the drain of the transistor M2 are electrically coupled to the fourth input, and the source of the transistor M2 is electrically coupled to a node 7;

wherein the gate, the source and the drain of the transistor M3 are electrically coupled to the node 1, the sixth input and the node 7, respectively;

wherein the gate, the source and the drain of the transistor M4 are electrically coupled to a node 14, the sixth input and a node 6 that is electrically coupled to both the node 7 and the node 4, respectively; and wherein the gate, the source and the drain of the transistor M6 are electrically coupled to the second input, the sixth input and the node 4, respectively;

f. a second discharge control circuit comprising transistors M7, M8, M9 and M11, each of the transistors M7, M8, M9 and M11 having a gate, a source and a drain, wherein both the gate and the drain of the transistor M7 are electrically coupled to the second input, and the source of the transistor M7 is electrically coupled to a node 9;

wherein the gate, the source and the drain of the transistor M8 are electrically coupled to the node 1, the sixth input and the node 9, respectively;

wherein the gate, the source and the drain of the transistor M9 are electrically coupled to the node 14, the sixth input and a node 8 that is electrically coupled to the node 9, respectively; and wherein the gate, the source and the drain of the transistor M11 are electrically coupled to the forth input, the sixth input IN6 and a node 11 that is electrically coupled to the node 9, respectively;

g. a second discharge transistor M10 having a gate electrically coupled to the node 8, a source electrically coupled to the sixth input and a drain electrically coupled to a node 10, wherein the node 10 is electrically coupled to the node 5;

h. a pull-up transistor M13 having a gate electrically coupled to the node 10, a source electrically coupled to a node 15 and a drain electrically coupled to a node 13, wherein the node 15 is electrically coupled to both the node 14 and the first output, and the node 13 is electrically coupled to the first input;

i. a transistor M12 having a gate electrically coupled to the node 10, a source electrically coupled to the second output and a drain electrically coupled to the node 13; and j. a transistor M15 having a gate electrically coupled to the third input, a source electrically coupled to the node 15 and a drain electrically coupled to the sixth input, wherein the plurality of stages $\{S_j\}$ are electrically coupled in serial with that the fifth input of the first stage S1 is electrically coupled to a start pulse input line for receiving a start pulse signal and the fifth input of the i-th stage Si, i=2, 3, ..., N, is electrically coupled to the second output of the (i−1)-th stage Si−1, for receiving a corresponding output signal therefrom.

11. The shift register of claim 10, wherein each of the first to fourth inputs of the j-th stage $S_j$ are adapted for receiving a corresponding signal of a first to fourth clock signals.

12. The shift register of claim 11, wherein each of the first to fourth clock signals is characterized with a frequency and a phase, wherein the frequency of the first clock signal and the frequency of the third clock signal are substantially identical and the phase of the first clock signal and the phase of the third clock signal are substantially reversed, and wherein the frequency of the second clock signal and the frequency of the fourth clock signal are substantially identical and the phase of the second clock signal and the phase of the fourth clock signal are substantially reversed, respectively.

13. The shift register of claim 12, wherein the frequency of the first clock signal is higher than the frequency of the second clock signal.

14. The shift register of claim 13, wherein the pull-up transistor M13 of the j-th stage $S_j$ is controllable by the first clock signal.

15. The shift register of claim 14, wherein both the first discharge control circuit and the second discharge control circuit of the j-th stage $S_j$ are controllable by the second clock signal.

16. The shift register of claim 11, wherein the sixth input of the j-th stage $S_j$ is adapted for receiving a supply voltage.

17. The shift register of claim 16, wherein the first output of the j-th stage $S_j$ is adapted for providing a gate driving signal to a corresponding gate line responsive to the first to fourth clock signals and an input signal.

18. The shift register of claim 17, wherein the gate driving signal is shifted from the input signal received by the fifth input.

19. The shift register of claim 18, wherein the second output of the j-th stage $S_j$ is adapted for providing an output signal having a frequency and a phase that are substantially same as those of the gate driving signal, respectively.

20. The shift register of claim 19, wherein the j-th stage $S_j$, j=1, . . . , N, further comprises:
 a. a seventh input; and
 b. a transistor M14 having a gate electrically coupled to the seventh input, a source electrically coupled to the sixth input and a drain electrically coupled to the node 14.

21. The shift register of claim 20, wherein for the i-th stage Si, i=1, . . . , N−1, the seventh input of the stage Si is adapted for receiving an output signal from its immediately next stage Si+1.

22. The shift register of claim 20, wherein at least one of the transistors M1-M15 comprises a field-effect thin film transistor.

23. A method for driving a shift register, the shift register having a plurality of stages, $\{S_j\}$, j=1, 2, . . . , N, N being a positive integer, electrically coupled in serial, comprising the steps of:
 a. providing the first stage of the plurality of stages $\{S_j\}$ a start pulse signal, SP;
 b. providing the plurality of stages $\{S_j\}$ a first pair of clock signals, CLK1 and XCLK1, with a first frequency, $f_1$;
 c. providing the plurality of stages $\{S_j\}$ a second pair of clock signals, CLK2 and XCLK2, with a second frequency, $f_2$, wherein the second frequency $f_2$ is different from the first frequency $f_1$; and
 d. generating a plurality of signals responsive to the start pulse signal, the first pair of clock signals, CLK1 and XCLK1, and the second pair of clock signals, CLK2 and XCLK2, wherein each of the plurality of signals is sequentially shifted from the start pulse signal SP.

24. The method of claim 23, wherein the first frequency f1 is higher than the second frequency f2.

25. The method of claim 23, wherein the phase of clock signal CLK1 is substantially reversed from the phase of clock signal XCLK1.

26. The method of claim 23, wherein the phase of clock signal CLK2 is substantially reversed from the phase of clock signal XCLK2.

27. A shift register, comprising:
 a. means for providing a first pair of clock signals, CLK1 and XCLK1, with a first frequency, $f_1$, and a second pair of clock signals, CLK2 and XCLK2, with a second frequency, $f_2$, wherein the second frequency $f_2$ is different from the first frequency $f_1$; and
 b. means for generating a plurality of signals responsive to a start pulse signal, the first pair of clock signals CLK1 and XCLK1, and the second pair of clock signals CLK2 and XCLK2, wherein each of the plurality of signals is sequentially shifted from the start pulse signal.

28. The shift register of claim 27, wherein the first frequency f1 is higher than the frequency of the second frequency f2.

29. The shift register of claim 27, wherein the phase of clock signal CLK1 is substantially reversed from the phase of clock signal XCLK1.

30. The shift register of claim 27, wherein the phase of clock signal CLK2 is substantially reversed from the phase of clock signal XCLK2.

31. The shift register of claim 27, wherein the providing means comprises a phase-delayed clock signal generator.

32. The shift register of claim 27, wherein the generating means comprises a plurality of stages, $\{S_j\}$, j=1, 2, . . . , N, N being a positive integer, wherein the j-th stage $S_j$ comprises:
 a. a first to fourth inputs, each input adapted for receiving one of the first pair of clock signals CLK1 and XCLK1 and the second pair of clock signals CLK2 and XCLK2;
 b. a fifth input for receiving an input signal;
 c. a first output for outputting a gate driving signal responsive to the clock signals CLK1, CLK2, XCLK1 and XCLK2 and the input signal; and
 d. a second output for outputting an output signal having a frequency and a phase that are substantially same as those of the gate driving signal, respectively,
 wherein the plurality of stages are electrically coupled in serial such that the fifth input of a first stage is electrically coupled to a start pulse input line for receiving a start pulse signal and the fifth input of each of the rest of the plurality of stage is electrically coupled to the second output of its immediately prior stage for receiving an output signal therefrom.

* * * * *